US006049225A

United States Patent [19]
Huang et al.

[11] Patent Number: 6,049,225
[45] Date of Patent: *Apr. 11, 2000

[54] INPUT/OUTPUT INTERFACE CIRCUITRY FOR PROGRAMMABLE LOGIC ARRAY INTEGRATED CIRCUIT DEVICES

[75] Inventors: Joseph Huang, San Jose; Richard G. Cliff, Milpitas; Srinivas T. Reddy, Fremont, all of Calif.

[73] Assignee: Altera Corporation, San Jose, Calif.

[ * ] Notice: This patent is subject to a terminal disclaimer.

[21] Appl. No.: 09/023,369

[22] Filed: Feb. 13, 1998

Related U.S. Application Data

[63] Continuation of application No. 08/519,045, Aug. 24, 1995, Pat. No. 5,764,080.

[51] Int. Cl.$^7$ ................................................. H03K 19/177
[52] U.S. Cl. ................................................. 326/41; 326/39
[58] Field of Search ............................... 326/39, 41, 101, 326/40

[56] References Cited

U.S. PATENT DOCUMENTS

| | | |
|---|---|---|
| Re. 34,363 | 8/1993 | Freeman . |
| 3,473,160 | 10/1969 | Wahlstrom . |
| 4,609,986 | 9/1986 | Hartmann et al. . |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. . |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 5,121,006 | 6/1992 | Pedersen . |
| 5,208,491 | 5/1993 | Ebeling et al. . |
| 5,220,214 | 6/1993 | Pedersen . |
| 5,258,668 | 11/1993 | Cliff et al. . |
| 5,260,610 | 11/1993 | Pedersen et al. . |
| 5,260,611 | 11/1993 | Cliff et al. . |
| 5,274,581 | 12/1993 | Cliff et al. . |
| 5,350,954 | 9/1994 | Patel . |
| 5,371,422 | 12/1994 | Patel et al. . |
| 5,394,033 | 2/1995 | Tsui et al. . |
| 5,455,525 | 10/1995 | Ho et al. . |
| 5,490,074 | 2/1996 | Agrawal et al. ................... 326/39 |
| 5,504,439 | 4/1996 | Tavana . |
| 5,606,266 | 2/1997 | Pedersen . |
| 5,689,195 | 11/1997 | Cliff et al. . |

OTHER PUBLICATIONS

R.C. Minnick, "A Survey of Microcellular Research," Journal of the Association for Computing Machinery, vol. 14, No. 2, pp. 203–241 (Apr. 1967).

S.E. Wahlstrom, "Programmable Logic Arrays—Cheaper by the Millions," Electronics, pp. 90–95 (Dec. 11, 1967).

*Recent Developments in Switching Theory*, A. Mukhopadhyay, ed., Academic Press, New York, chapters VI and IX, pp. 229–254 and 369–422 (1971).

M. Morris Mano, *Computer Engineering: Hardware Design*, Prentice–Hall, Inc., New Jersey, pp. 103–105 (1988).

El Gamal et al., "An Architecture for Electrically Configurable Gate Arrays," IEEE Journal–State Circuits, vol. 24, No. 2, pp. 394–398 (Apr. 1989).

El–Ayat et al., "A CMOS Electrically Configurable Gate Array," IEEE Journal of Solid–State Circuits, vol. 24, No. 3, pp. 752–762 (Jun. 1989).

*Primary Examiner*—Michael Tokar
*Assistant Examiner*—Vibol Tan
*Attorney, Agent, or Firm*—Fish & Neave; Robert R. Jackson; Garry J. Tuma

[57] ABSTRACT

In a programmable logic array integrated circuit device, various techniques are used to increase the flexibility with which the core logic of the device can be connected to the input and/or output pins of the device. While the techniques shown greatly increase circuit flexibility, they avoid the unnecessary overhead of interconnectivity which is completely general.

3 Claims, 12 Drawing Sheets

INPUT/OUTPUT INTERFACE CIRCUITRY FOR PROGRAMMABLE LOGIC ARRAY INTEGRATED CIRCUIT DEVICES

CROSS REFERENCE TO RELATED APPLICATION

This is a continuation of commonly assigned U.S. patent application Ser. No. 08/519,045, filed Aug. 24, 1995, now U.S. Pat. No. 5,764,080.

BACKGROUND OF THE INVENTION

This invention relates to programmable logic array integrated circuit devices, and more particularly to improved circuitry for interfacing between the core programmable logic circuitry of such devices and their input and/or output pins.

Programmable logic array integrated circuit devices are well known as shown, for example, by Pedersen et al. U.S. Pat. No. 5,260,610 and Cliff et al. U.S. Pat. No. 5,260,611. Although other constructions of such devices are known and can be used with this invention, in devices of the general type shown in the above-mentioned Pedersen et al. and Cliff et al. patents a large number of regions of programmable logic are disposed on the device in a two-dimensional array of intersecting "rows" and "columns" of such regions. Each region is programmable to perform any of several logic functions on signals applied to that region. Each row may have several associated "horizontal" conductors for conveying signals to, from, and/or between the regions in the row. Each column may have associated "vertical" conductors for conveying signals from row to row. Programmable connections may be provided for selectively connecting the conductors adjacent to each region to the inputs and outputs of the region, and also for selectively connecting various conductors to one another (e.g., connecting a horizontal conductor to a vertical conductor). Interconnection of regions through the above-mentioned conductors and programmable connections makes it possible for the programmable logic array device to perform much more complicated logic functions than can be performed by the individual regions.

Input and/or output pins (generally referred to for convenience herein as input/output or I/O pins) are provided on these devices to allow external signals to enter the device for processing and to allow logic signals produced by the device to exit from the device and be applied to external circuitry. For example, such input/output pins may be located adjacent each end of each row and adjacent each end of each column. Programmable connectors may be provided for selectively connecting each input/output pin to selected ones of the horizontal conductors of the row that the input/output pin is adjacent to the end of, or to the vertical conductors of the column that the input/output pin is adjacent to the end of.

Advances in integrated circuit fabrication technology have made it possible to produce programmable logic array devices with very large numbers of logic regions. Such devices need large numbers of input/output pins. As the number of logic regions and input/output pins increases, it becomes increasingly important to carefully select the numbers and arrangements of the interconnection conductors and the programmable connections between those conductors, as well as between the conductors and the regions and input/output pins. Complete generality of these interconnection resources (i.e., so that any desired interconnection can be made no matter what other interconnections are made) would lead to exponential growth in the chip area occupied by the interconnection resources as the number of logic regions and input/output pins increases. Moreover, most of these completely general resources would be unused and therefore wasted in virtually all applications of the device. On the other hand, many applications of the device may require substantial interconnection resources, and because the device is intended to be a general-purpose device, it is extremely important for commercial success that the device be capable of satisfying a very wide range of potential applications, many of the requirements of which cannot be known in advance by the designer of the programmable logic array device.

Considerations such as the foregoing make it essential to provide increasingly sophisticated interconnection resources on programmable logic array devices, including in the area of the interface between the input/output pins and the core programmable logic of the device. For example, external circuit constraints may dictate use of certain input/output pins for particular signals, but optimum use of the core logic may require the ability to switch these signals fairly generally relative to the core logic. Again, complete generality of such input/output-to-core interconnection capability is wasteful, so more sophisticated arrangements of such interconnections are needed to provide a high degree of flexibility without such disadvantages as excessive real estate requirements, undue circuit loading, and large speed penalties.

In view of the foregoing it is an object of this invention to provide improved programmable logic array devices.

It is a more particular object of this invention to provide improved arrangements of interconnections between the input/output pins of programmable logic array devices and the core programmable logic of those devices.

SUMMARY OF THE INVENTION

These and other objects of the invention may be accomplished in accordance with the principles of the invention by providing multiple levels of switching between the interconnection conductors in the programmable logic core of a programmable logic array device and the input/output pins of the device. These multiple levels of switching allow increased generality of connection between the interconnection conductors and the input/output pins without going to the wasteful extreme of providing complete generality of such connections.

Another way in which connection flexibility to the input/output pins can be improved is to provide a dedicated connection between each input/output pin and predetermined ones of the programmable logic regions in the core of the device. Because each region is already provided with a high degree of interconnection capability within the core, this gives the associated input/output pin a similar high degree of interconnection capability.

Still another way to increase input/output-to-core connection flexibility in accordance with this invention is to provide additional interconnection conductors which can be used to transmit signals to or from each input/output pin and larger portions (preferably all) of the core if needed as an alternate or addition to the usual connections between the input/output pin and a more localized portion of the core.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
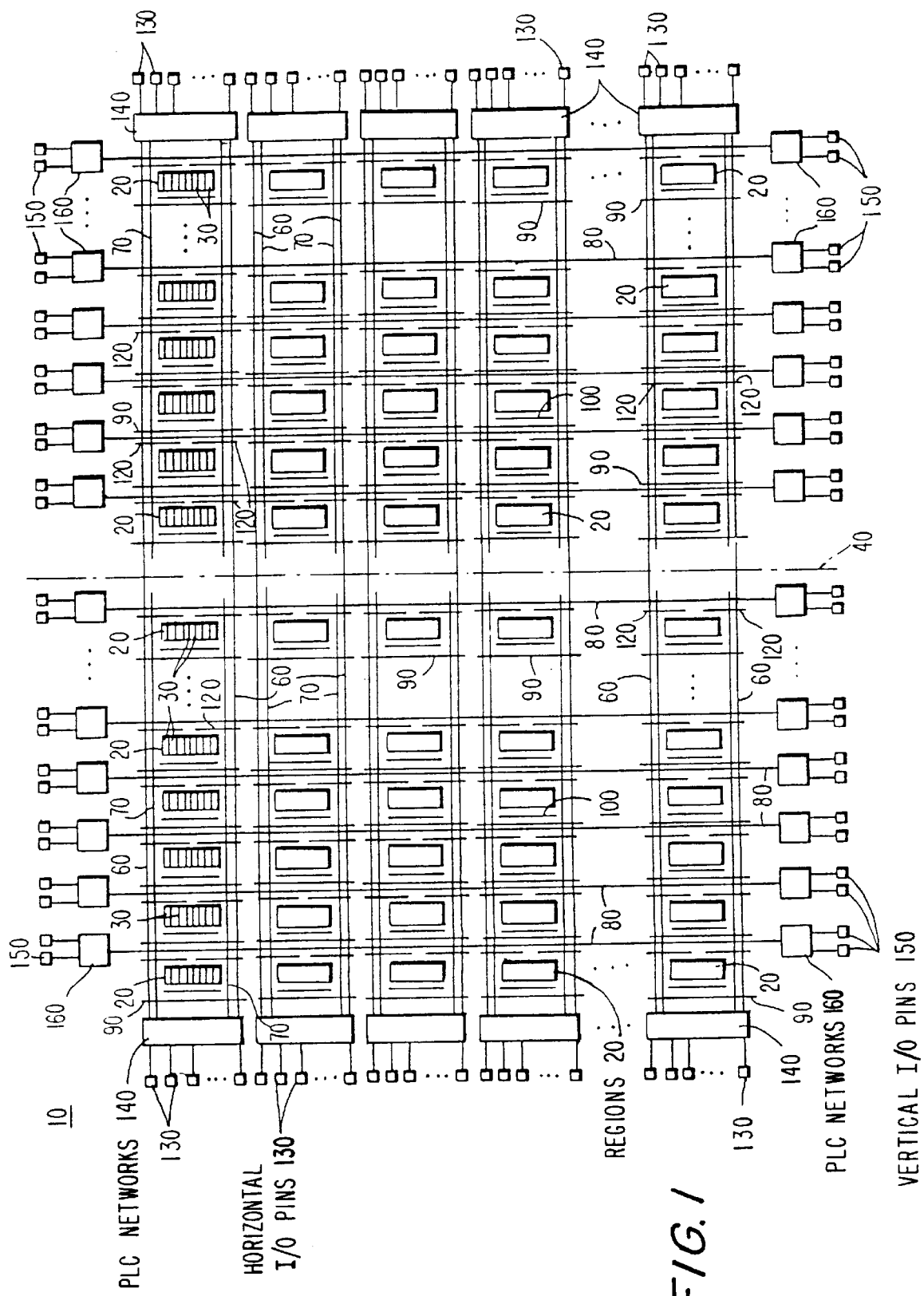
FIG. 1 is a simplified, partial, schematic block diagram of an illustrative programmable logic array device that can be constructed in accordance with the principles of this invention.

FIG. 1 shows an illustrative programmable logic array device 10 which can be constructed or readily modified in accordance with various features of this invention. It will be understood that the present invention is equally applicable to many other types and constructions of logic array devices and that device 10 is described herein only as an example of a device in which the invention can be used.

As shown in FIG. 1 device 10 has a plurality of regions 20 of programmable logic disposed on the device in a two-dimensional array of intersecting rows and columns of such regions. In the depicted preferred embodiment device 10 has ten rows and 36 columns of regions 20. The columns are divided into two groups of 18 on respective opposite sides of a central vertical axis 40.

Each region 20 includes a plurality of subregions or logic modules 30 of programmable logic. In the depicted preferred embodiment there are eight logic modules 30 in each region 20. To simplify FIG. 1 the subdivision of regions 20 into logic modules 30 is only shown in the first row of that FIG. Although logic modules 30 may be constructed in many other ways (e.g., as product-term-based macrocells), in the depicted preferred embodiment (see especially FIG. 2) each logic module includes a four-input look-up table or comparable universal logic block ("ULB") 32 and a flip-flop or register device 34. Each ULB 32 can be independently programmed to provide as an output signal any logical combination of four inputs 36 to the logic module 30 that includes that ULB. The output signal of the ULB can be registered by the associated flip-flop 34 and then made the output signal 38 of the logic module, or the output signal of the ULB can be applied directly to output 38 (i.e., without registration by the flip-flop).

Each row of regions 20 has two groups of horizontal interconnection conductors 60 that extend the entire length of the row, one group of conductors 60 being above the row and the other group being below the row. In the depicted preferred embodiment each of these groups includes 72 conductors. (In some other views such as FIG. 2 all of conductors 60 associated with a row are shown on one side of the row for greater simplicity.) Conductors 60 are sometimes referred to as full-horizontal conductors or as global horizontal conductors.

Each row of regions 20 also has four groups of horizontal interconnection conductors 70 that extend along half the length of the row. Two of these groups extend respectively along the top and bottom of the left half of the row. The other two groups of these conductors 70 extend respectively along the top and bottom of the right half of the row. In the depicted preferred embodiment each of these groups includes 36 conductors. (Again, in some other FIGS. all of the conductors 70 associated with the left or right half of a row are shown on one side of the row for greater simplicity.) The conductors 70 associated with each half of a row are not directly connectable to the conductors 70 associated with the other half of the row. Conductors 70 are sometimes referred to as half-horizontal conductors.

Each column of logic regions has a group of vertical interconnection conductors 80 that extend along the entire length of the column. In the depicted preferred embodiment each of these groups includes 24 conductors 80.

In order to feed logic signals to each region 20, each regular logic region has an associated plurality of region feeding conductors 90 that can bring signals to the logic region from the horizontal conductors 60 and 70 associated with that region. In the depicted preferred embodiment there are 22 region feeding conductors 90 associated with each regular logic region 20. The manner in which conductors 90 are programmably connectable to conductors 60, 70, and 36 (FIG. 2) will be discussed in detail below.

Each region 20 also has eight associated local feedback conductors 100. Each conductor 100 makes the output signal 38 (FIG. 2) of a respective one of the logic modules 30 in the associated region 20 available as an input to any of the logic modules in that region without having to use any interconnection resources that are not exclusively associated with the region.

Each region 20 also has output conductors 120 for conveying the output logic signals 38 (FIG. 2) of the logic modules 30 in that region to the associated conductors 60 and 70. Conductors 120 convey the output signals of the upper four logic modules 30 in a region 20 to the conductors 60 and 70 that are above the region. Other conductors 120 associated with the region convey the output signals of the lower four logic modules 30 in the region to the conductors 60 and 70 that are below the region. The manner in which conductors 120 are programmably connectable to conductors 60 and 70 is discussed in more detail below. The output signals 38 is (FIG. 2) of each regular logic region 20 are also programmably connectable to the vertical conductors 80 associated with that region. This will also be discussed in more detail below.

Programmable logic connectors ("PLCs") (not shown in FIG. 1 but shown elsewhere such as at 242 in FIG. 2) are associated with each regular logic region 20 for making connections from the vertical (80) to the horizontal (60 and 70) conductors associated with the region. Other PLCs (not shown in FIG. 1 but shown elsewhere such as at 270 in FIG. 2) are associated with each regular logic region 20 for making connections from the horizontal (60) to the vertical (80) conductors associated with the region.

PLCs 242 and 270 (and other PLCs used throughout device 10) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not generally shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473, 160), ferro-electric memories, fuses, antifuses, or the like. Any of these technologies can also be used to implement the programmable memories of above-described ULBs 32.

At each end of each row there are eight "horizontal" input/output pins 130. The input/output pins 130 associated with each end of each row are programmably connectable to the adjacent conductors 60 and 70 associated with that row via PLC networks 140. The construction of networks 140 is discussed in more detail below.

At the top and bottom of each column of regular logic regions 20 there are two "vertical" input/output pins 150. The input/output pins 150 associated with each end of each column are programmably connectable to the conductors 80 associated with that column via PLC networks 160. Networks 160 can be generally similar to networks 140.

Figure 2:
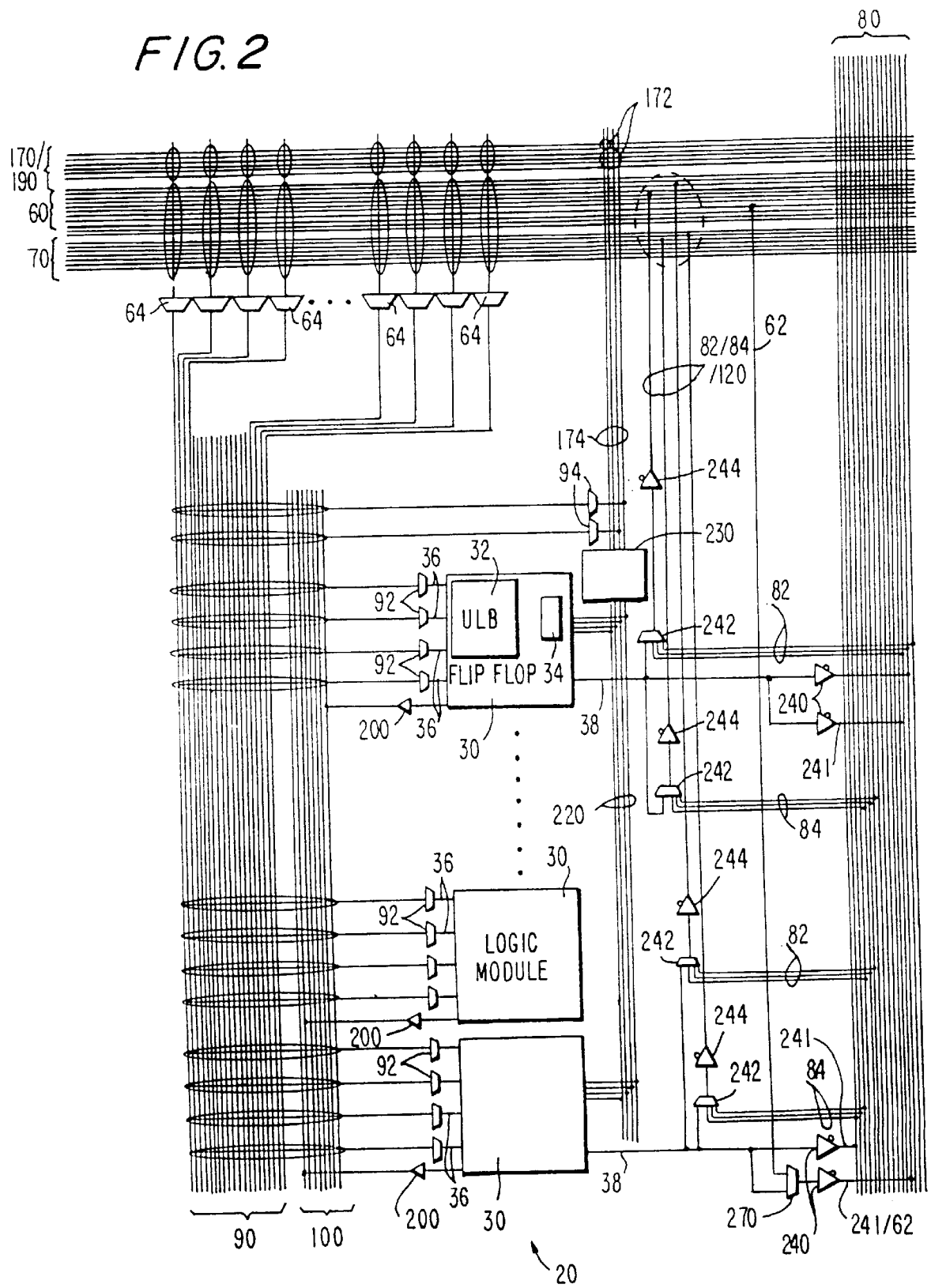
FIG. 2 is a more detailed, but still simplified, schematic block diagram of a representative portion of the apparatus of FIG. 1.
Figure 4:
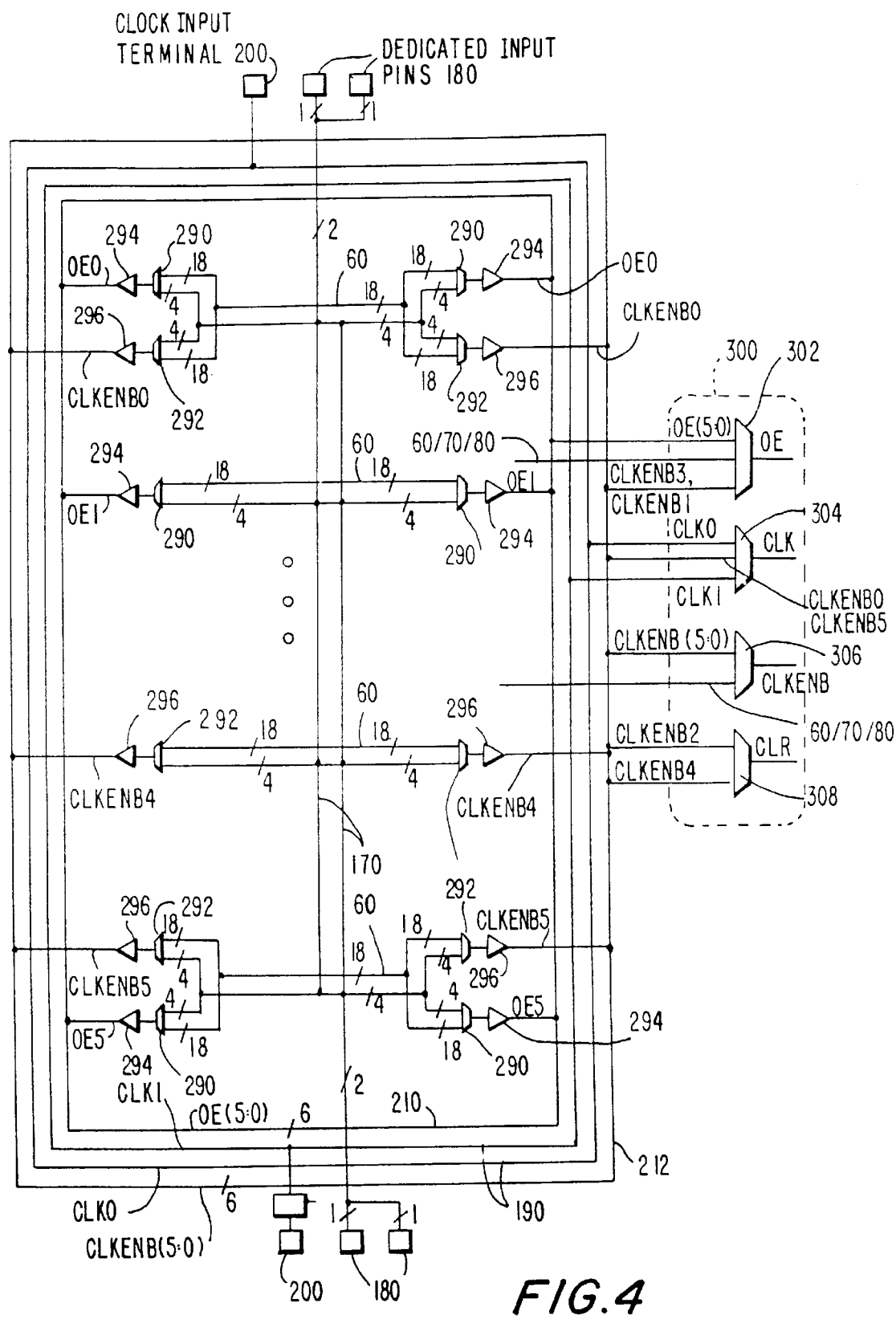
FIG. 4 is a simplified schematic block diagram of additional features of the apparatus of FIG. 1.

It will be apparent from the ensuing discussion that device 10 includes more circuitry than is shown in FIG. 1. For example, FIG. 4 shows that there are four so-called fast lines 170 that extend from four dedicated input pins 180 to the vicinity of every region 20 (see also FIG. 2). FIG. 4 also shows that the device is ringed by a so-called peripheral bus that includes two clock signal conductors 190 (extending from two dedicated clock input terminals 200), six output enable signal conductors 210, and six clock enable signal is conductors 212. FIG. 2 shows that the two clock signal conductors 190 (like fast conductors 170) extend to the vicinity of every region 20 on the device.

FIG. 2 illustrates some of the connections of a typical region 20 in somewhat more detail than FIG. 1. It will be understood, however, that FIG. 2 tends to show only a few representative conductors of each type.

FIG. 2 shows that there are several programmable connections 62 from the conductors 60 associated with each row to the conductors 80 associated with each column. In the depicted preferred embodiment there are four such programmable connections 62 from each row to each column. The connections 62 along each row are distributed over the conductors 60 associated with that row. Similarly, the connections 62 along each column are distributed over the conductors 80 associated with that column.

FIG. 2 also shows that there are programmable connections 82 from the conductors 80 associated with each column to the conductors 60 associated with each row, as well as programmable connections 84 from the conductors 80 associated with each column to the conductors 70 associated with each row. The connections 82 and 84 along each column are distributed over the conductors 80 associated with that column. Similarly, the connections 82 and 84 along each row are respectively distributed over the conductors 60 and 70 associated with that row.

FIG. 2 further shows that each logic module 30 in each region 20 in a row can drive one conductor 60 and one conductor 70 associated with the row that includes that region. This is done via programmable connections 120, which are, of course, also shown in FIG. 1 and partly described above. FIG. 2 shows that the connections 120 along a row are distributed over the conductors 60 and 70 associated with that row.

FIG. 2 also shows the availability of the four fast conductors 170 and the two dedicated clock conductors 190 adjacent each region 20 in a row.

FIG. 2 still further shows that each of the 22 region feeding conductors 90 associated with a region receives the output of a PLC 64 (a 21 to 1 multiplexer in the depicted, presently preferred embodiment) associated with that conductor 90. The 21 inputs to each PLC 64 associated with a region are different subsets of fast conductors 170, dedicated clock conductors 190, the conductors 60 associated with the row that includes the region, and the conductors 70 associated with the half row that includes the region. Thus the inputs to each PLC 64 are a partial population of the conductors 60, 70, 170, and 190 associated with the region. As a multiplexer, each of PLCs 64 is programmable to connect any one of its inputs to its output. This is similarly true of the other multiplexers mentioned throughout this specification.

The main output logic signal 38 of each logic module 30 in a region 20 is applied (via a feedback buffer 200) to a respective one of the local feedback conductors 100 associated with that region. As was mentioned in connection with FIG. 1, local feedback conductors 100 are associated with each region 20 to make the output of each logic module 30 in the region available as a possible input to any logic module in the region without having to use any of the more general interconnection resources of the chip to provide such local interconnectivity.

The signal on any of conductors 90 or 100 associated with a region 20 can be applied to any of the main inputs 36 of any logic module 30 in that region via a PLC 92 (a 30 to 1 multiplexer in the depicted, presently preferred embodiment) that is associated with that input 36. Thus the inputs to each PLC 92 are a full population of associated conductors 90 and 100.

Each logic module 30 in a region 20 can also receive any of several control signals via leads 220. The signals on these leads may be used by the logic module for such purposes as a clock signal for the flip-flop 34 of the logic module and/or a clear signal for the flip-flop of the logic module. Circles 172 in FIG. 2 represent fully populated PLCs for selectively bringing the signals on fast leads 170 and dedicated clock conductors 190 into the region via leads 174 for possible use on leads 220 in that region. Certain of leads 174 can alternatively carry so-called asynchronous clock and/or clear signals derived from the conductors 90 and/or 100 associated with the region. PLCs 94 (similar in all respects to above-described PLCs 92) are provided to connect any of conductors 90 and 100 to selected leads 174 to make these asynchronous clock and/or clear signals available. Although two PLCs 94 are shown in FIG. 2, a larger number (such as four) is preferred.

The signals on leads 174 are applied to programmable inversion and buffering circuitry 230. This circuit buffers each applied signal, and may also invert any applied signal under programmable control. The output signals of circuit 230 are made available to each logic module 30 in the region via conductors 220.

The main output logic signal 38 of each logic module 30 in a region 20 can be applied (via programmably controlled tri-state drivers 240 and leads 241) to either or both of two conductors 80 associated with the column is that includes that region. In some cases these circuits additionally include PLCs 270 (multiplexers in the presently preferred embodiment) so that the associated drivers 240 can alternatively be used for making connections 62 from conductors 60 to conductors 80. The output signal 38 of each logic module in a region can alternatively or additionally be applied (via PLCs 242 (multiplexers in the presently preferred embodiment) and programmably controlled tri-state drivers 244) to one of conductors 60 and/or to one of conductors 70 associated with that region. The other inputs to each of PLCs 242 (i.e., on the leads designated 82 or 84 in FIG. 2) are signals from several of the conductors 80 associated with the region. Thus any of PLCs 242 and drivers 244 can alternatively be used to apply a signal on a conductor 80 to a conductor 60 or 70 associated with the region. The inputs 82/84 from conductors 80 to PLCs 242 are distributed over conductors 80. Similarly, the outputs from drivers 240 are distributed over conductors 80, and the outputs from drivers 244 are distributed over conductors 60 and 70.

Figure 3:
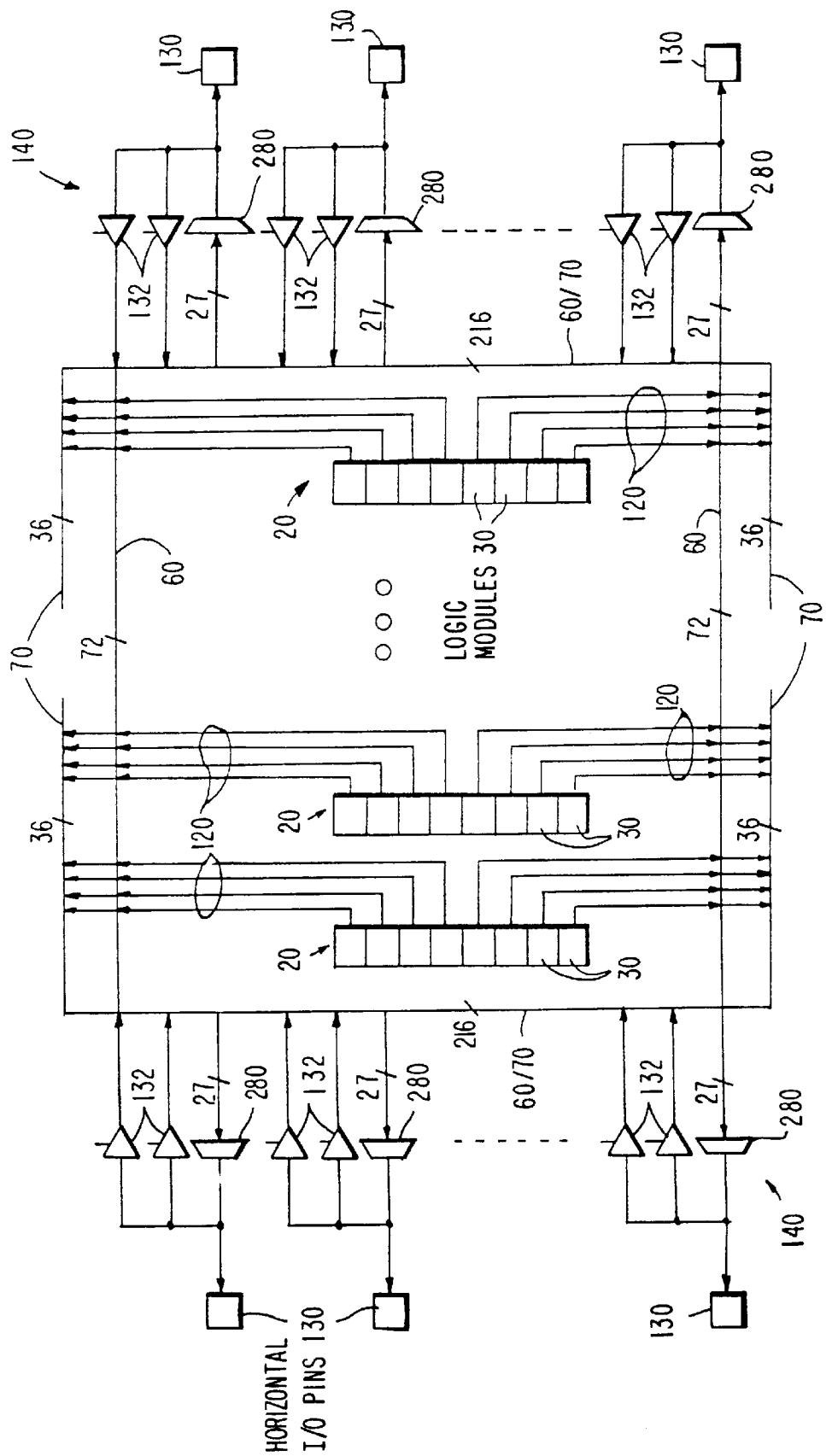
FIG. 3 is another more detailed, but still simplified, schematic block diagram of a representative portion of the apparatus of FIG. 1.

FIG. 3 shows some additional aspects of the connections to and from the conductors 60 and 70 for a typical row. As mentioned in connection with FIG. 1, each row has eight associated input/output pins 130 adjacent each end of the row. Also there are 144 conductors 60 and 72 conductors 70, for a total of 216 conductors 60/70 at each end of each row. (Each conductor 60, of course, appears at both ends of the associated row. Thus each conductor 60 is connectable to a pin 130 at either end of its row.) The conductors 60/70 at each end of a row are divided into eight different groups of 27 conductors each, and the conductors in each such group are applied to the 27 inputs of a respective one of PLCs 280 (27 to 1 multiplexers in the presently preferred embodiment). Each PLC 280 can select one of its inputs for application to an associated input/output pin 130 when that pin is to be used as a chip output.

For use of pins 130 as chip inputs, the signal on each pin 130 is applied to the inputs of two associated, programmable, tri-state drivers 132, the outputs of which are applied to different ones of conductors 60 in the row associated with that pin 130.

FIG. 3 also shows again that in each row half of the conductors 60 and 70 are above the logic regions 20 of that row, and the other half of conductors 60 and 70 are below those logic regions. And, as FIG. 3 shows, the upper four logic modules 30 in each region in a row supply their output signals 38 or 120 to the conductors 60/70 that are above the row, while the lower four logic modules in each region supply their output signals 38 or 120 to the conductors 60/70 that are below the row.

FIG. 4 has already been partly considered but will now be fully discussed. As has been mentioned, there is a so-called peripheral bus that extends in a closed the periphery of device 10. This peripheral bus includes the two dedicated clock signal conductors 190, six output enable conductors 210 (numbered 0 through 5, respectively), and six clock enable conductors 212 (numbered 0 through 5, respectively). Conductor 210 and 212 can be driven by the conductors 60 associated with each row that are drivable by the top-most logic module 30 in each region 20 in that row. Numbering the rows 0 through 9 from top to bottom, the following table shows the peripheral bus signals that are derivable from each row (where OE stands for output enable and CLKENB stands for clock enable):

TABLE 1

| Row Number | Peripheral Bus Signal(s) |
|---|---|
| 0 | OE0 |
|  | CLKENB0 |
| 1 | OE1 |
| 2 | CLKENB1 |
| 3 | OE2 |
| 4 | CLKENB2 |
| 5 | 0E3 |
| 6 | CLKENB3 |
| 7 | OE4 |
| 8 | CLKENB4 |
| 9 | CLKENB5 |
|  | OE5 |

FIG. 4 shows the circuitry associated with representative rows for deriving the output enable and clock enable signals as in the foregoing table. This circuitry is exactly duplicated at both ends of each row to reduce signal propagation delay to and on the peripheral bus. Only one end of each row needs to be actually considered in connection with the following discussion.

Considering first the top-most row (row 0 in Table 1), the 18 conductors 60 that can receive output signals from the top logic module 30 of each region in the row are applied to PLCs 290 and 292 (22 to 1 multiplexers in the presently preferred embodiment) associated with that row. The four fast conductors 170 are also applied to those PLCs. PLCs 290 select one of their inputs as the OE0 signal and apply that signal (via drivers 294) to OE0 peripheral bus conductor 210. PLCs 292 similarly select one of their inputs as the CLKENB0 signal and apply that signal (via drivers 296) to the CLKENB0 peripheral bus conductor 212.

In the second row the 18 conductors 60 that can receive the output signal of the top-most logic module 30 of each region in the row are connected to PLCs 290. The four fast conductors 170 are also connected to those PLCs. PLCs 290 select one of the applied signals for application (via drivers 294) to the OE1 peripheral bus conductor 210.

The next to last row shown in FIG. 4 is row 8. The PLCs 292 in that row receive the 18 conductors 60 that can carry the top-most logic module output signals of that row and the four fast conductors 170. PLCs 292 select one of these inputs as the CLKENB4 signal, which is applied via drivers 296 to the appropriate peripheral bus conductor 212.

The bottom row shown in FIG. 4 is row 9. It is similar to the top row (row 0), except that the output of PLCs 290 is the OE5 signal and the output of PLCs 292 is the CLKENB5 signal.

FIG. 4 also shows how the various peripheral bus signals are used in input/output cells associated with input/output pins 130 and 150. Representative circuitry 300 for generating an output enable signal, a clock signal, a clock enable signal, and a clear signal used in an input/output cell associated with an input/output pin 130 or 150 is shown in FIG. 4. PLC 302 (a 9 to 1 multiplexer in the presently preferred embodiment) receives the six output enable signals from conductors 210, one signal from a conductor 60 or 70 from the row associated with the pin 130 served by that cell 300 (or from a conductor 80 from the column associated with the pin 150 served by that cell 300), and the CLKENB0 and CLKENB1 signals from conductors 212. PLC 302 selects one of these nine inputs as the output enable signal of cell 300. PLC 304 (a 4 to 1 multiplexer in the presently preferred embodiment) receives the CLK0 and CLK1 signals from conductors 190, and the CKLENB0 and CLKENB5 signals from conductors 212. PLC 304 selects one of these signals as the clock signal of cell 300. PLC 306 (a 7 to 1 multiplexer in the presently preferred embodiment) receives the six clock enable signals from conductors 212 and one signal from a conductor 60/70 or a conductor 80, depending on whether cell 300 serves a pin 130 or a pin 150. PLC 306 can select one of its inputs as the clock enable signal of cell 300. Lastly, PLC 308 (a 2 to 1 multiplexer in the presently preferred embodiment) receives the CLKEND2 and CLKENB4 signals from conductors 212, and can select either of these two signals as the clear signal of cell 300.

Figure 5:
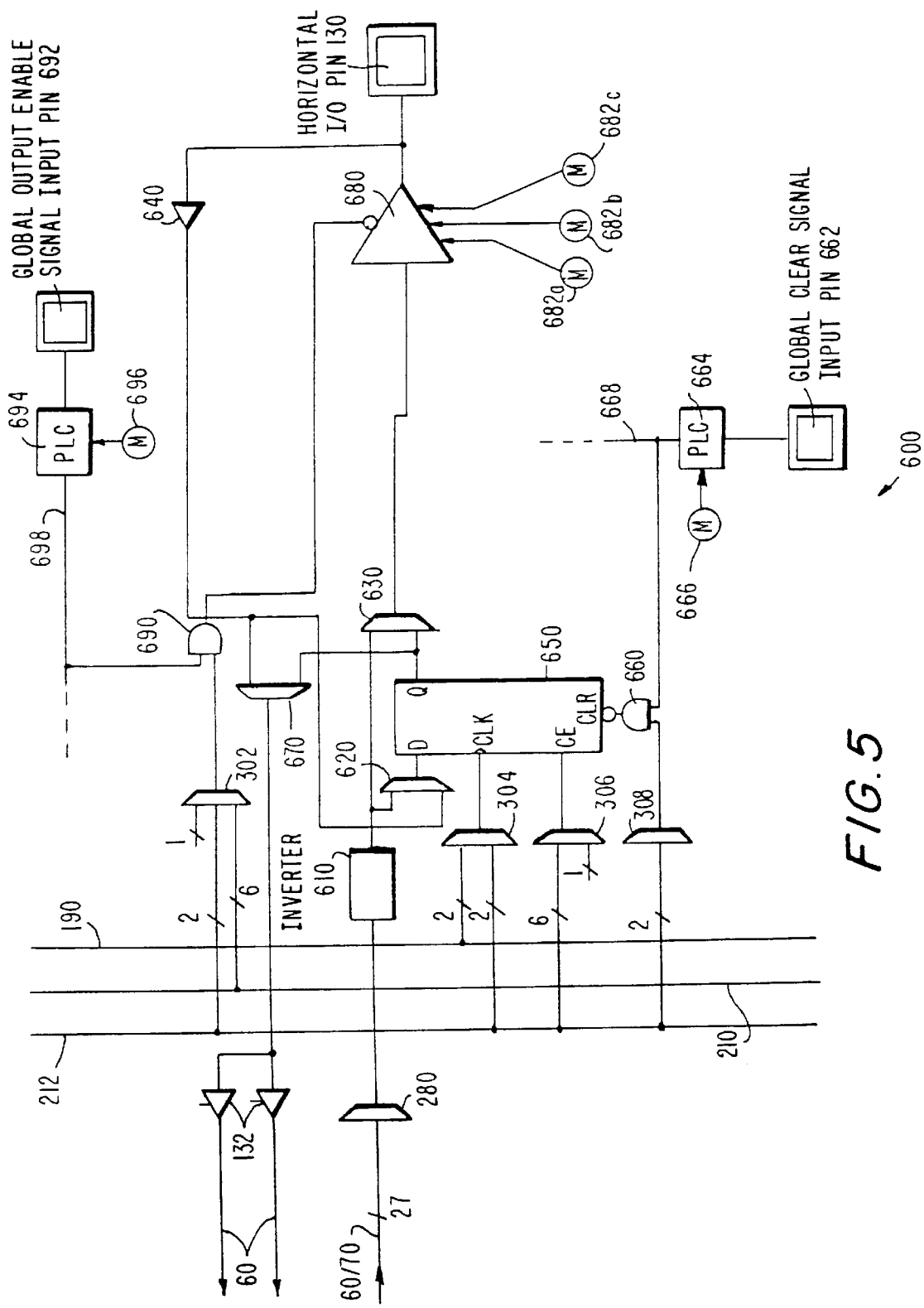
FIG. 5 is a more detailed, but still simplified, schematic block diagram of a portion of the circuitry shown in FIG. 3.

FIG. 5 shows a typical input/output cell 600 associated with a horizontal input/output pin 130. Similar input/output cells are associated with vertical input/output pins 150. However, in those cells the global horizontal 60 or half-horizontal 70 inputs and outputs shown in FIG. 5 are replaced by global vertical inputs and outputs 80. The size of the PLCs corresponding to PLCs 280 is also less in those cells because there are fewer global vertical conductors 80 associated with each column than there are horizontal conductors 60/70 associated with each row.

FIG. 5 shows that the output of PLC 280 (a multiplexer in the presently preferred embodiment) is applied to programmable inverter circuit 610. Inverter 610 either inverts or does not invert the applied signal, depending on whether an inversion option is selected by programming an FCE for that option. The output of programmable inverter 610 is applied to one is input of each of PLCs 620 and 630 (multiplexers in the presently preferred embodiment). The other input to PLC 620 is the output of TTL buffer 640 from I/O pad 130. Thus PLC 620 can be programmed to apply either a device output signal from PLC 280 or a device input signal from I/O pad 130 to the data input terminal of I/O cell flip-flop 650. The output of PLC 304 (a multiplexer in the presently preferred embodiment) is applied to the clock input terminal of flip-flop 650. The output of PLC 306 (a multiplexer in the presently preferred embodiment) is applied to the clock enable input terminal of flip-flop 650. (Flip-flop 650 can only take in new data via its data input terminal if its clock input is enabled by an appropriate signal applied to its clock enable input terminal.) The output signal of PLC 308 (a multiplexer in the presently preferred embodiment) is applied to the clear input terminal of flip-flop 650 via OR gate 660.

The data output of flip-flop 650 is applied to the second input terminal of PLC 630 and to one input terminal of PLC 670 (a multiplexer in the presently preferred embodiment). The other input to PLC 670 is the output signal of TTL buffer 640. The output signal of PLC 630 is applied to the data input terminal of tri-statable output driver 680. The signal applied to the control input terminal of driver 680 is the output signal of OR gate 690. One of the inputs to OR gate 690 is the output signal of PLC 302.

From the foregoing it will be seen that I/O cell 600 is programmable to allow flip-flop 650 to register either a device output signal passing through the cell from PLC 280 to I/O pad 130, or a device input signal passing through the cell from I/O pad 130 to drivers 132. Alternatively, I/O cell 600 is programmable to pass a signal of either of the foregoing types without registration by flip-flop 650.

To permit global clearing of the flip-flops 650 in all of cells 600, a global clear signal input pin 662 (similar to any of pins 130 or 150) is programmably selectively connectable to global clear conductor 668 via PLC 664. PLC 664 is controlled to make this connection by suitably programming option FCE 666. Global clear conductor 668 extends adjacent to all of cells 600 and is connected to a second input terminal of the OR gate 660 in each cell. In this way, if the global clear option is selected, a signal applied to input pin 662 can be used to simultaneously clear all of flip-flops 650 on device 10.

To permit global output enabling of drivers 680 in all of cells 600, a global output enable signal input pin 692 (similar to any of pins 130 or 150) is programmably selectively connectable to global output enable conductor 698 via PLC 694. PLC 694 is controlled to make this connection by suitably programming option FCE 696. Global output enable conductor 698 extends adjacent to all of cells 600 and is connected to a second input terminal of the OR gate 690 in each cell. In this way, if the global output enable option is selected, a signal applied to input pin 692 can be used to simultaneously enable all of devices 680 (assuming that those devices are otherwise programmed as described below to respond to an output enable control signal).

Each of devices 680 has several FCEs 682a, b, and c associated with it. FCE 682a is programmable to cause device 680 to produce either a slowed output or a fast output. This is useful to help stagger the outputs of the device to reduce noise and/or to adjust output signal timing. FCEs 682b and 682c are programmable to select various functions of device 680 as shown in the following table:

TABLE 2

| Bit 682b | Bit 682c | Buffer Function |
| --- | --- | --- |
| 0 | 0 | Input only |
| 0 | 1 | Tri-state output |
| 1 | 0 | Open drain |
| 1 | 1 | Output only |

When FCEs 682b and 682c are programmed as shown in the first line of this table, the associated I/O pad 130 is usable only as an input pin. When FCEs 682b and 682c are programmed as shown in the second line of this table, device 680 is controlled by the output signal of OR gate 690 to be either an enabled output driver or to present a high impedance to I/O pad 130, depending on the state of the output signal of OR gate 690. When FCEs 682b and 682c are programmed as shown in the third line of this table, device 680 provides an open drain connection to pin 130. When bits 682b and 682c are programmed as shown in the fourth line of the foregoing table, device 680 functions at all times as an output buffer.

Figure 6:
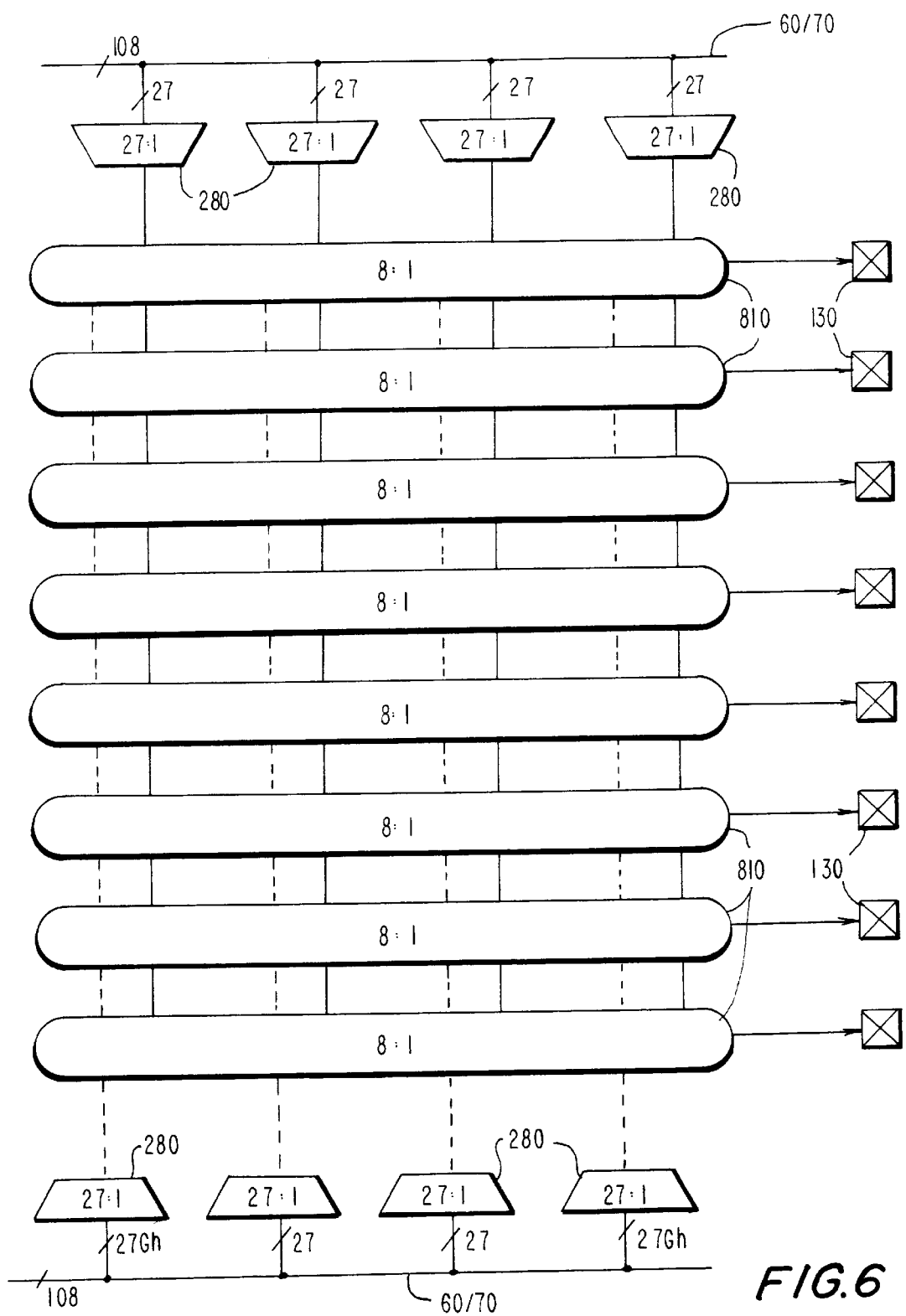
FIG. 6 is a simplified block diagram showing an illustrative modification of apparatus shown in FIG. 3 in accordance with this invention.

The input/output pin driving structure shown in FIG. 3 has the restriction that only certain horizontal conductors 60 and 70 in a row can drive each input/output pin 130 associated with that row. FIG. 6 shows a modified structure in accordance with this invention which substantially eliminates this restriction. As in FIG. 3 each of the conductors 60/70 at each end of a row in FIG. 6 feeds at least one of PLCs 280 at that end of the row. The output lead of each PLC 280 at each end of a row is one of the inputs to each of eight further PLCs 810 at that end of the row. (In the depicted preferred embodiment each of PLCs 810 is an 8 to 1 multiplexer.) Thus the inputs to each of PLCs 810 are a full population of the outputs of the PLCs 280 at the adjacent end of the associated row. The output signal of each of PLCs 810 can drive a respective one of the input/output pins 130 at that end of the row (e.g., via an input/output cell 600 of the type shown in FIG. 5). The FIG. 6 structure allows any conductor 60/70 appearing at an end of a row to drive any input/output pin 130 at that end of the row. In this way any logic module 30 in a row can drive any input/output pin 130 associated with that row. Moreover, this greatly increased output flexibility is achieved without the necessity for a fully populated 216 by 8 crosspoint switch matrix between the 216 conductors 60 and 70 and the eight input/output pins at each end of each row. Such large crosspoint switches would allow direct connection of any conductor 60/70 to any of input/output pins 130, but at much greater cost in terms of chip real estate consumed and numbers of FCEs required for programmable switching control.

Figure 7:
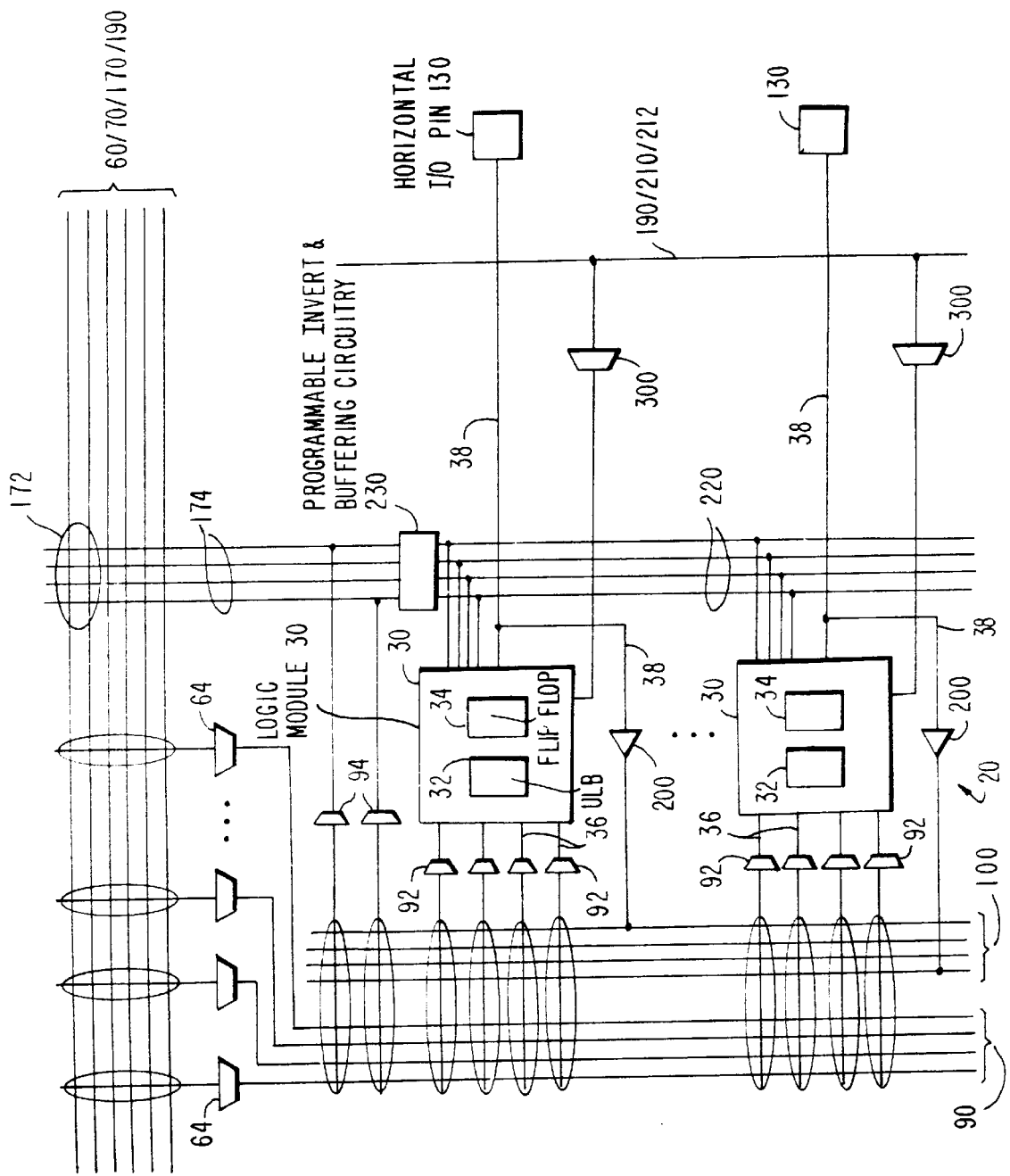
FIG. 7 is a simplified schematic block diagram showing another illustrative modification of apparatus shown in FIG. 3 in accordance with this invention.

FIG. 7 shows an alternative embodiment in accordance with this invention in which each horizontal input/output pin 130 at each end of a row can be driven by an associated logic module 30 in a region 20 at that end of the row. The region 20 and logic modules 30 shown in FIG. 7 can be similar to the normal programmable logic regions 20 and modules 30 described above, and thus the same reference numbers are used in FIG. 7 for components that can be similar to those described previously. As in other regions 20, the region 20 in FIG. 7 can receive the signals on any of conductors 60 and 70 (and even conductors 170 and 190 if desired) via PLCs 64 and region feeding conductors 90. Local feedback conductors 100 make the main output signal 38 of each logic module in a is region available as a possible input to any logic module in the region. The signals on any of conductors 90 and 100 can be applied to any of the four inputs of the ULB 32 in each logic module via the PLCs 92 that are associated with that logic module. Each ULB 32 is programmable to provide any logical combination of the four signals applied to that ULB. The output signal of each ULB can be registered by the associated flip-flop 34 to produce associated output 38, or the ULB output can bypass the flip-flop and be used directly as output 38. Logic module control signals such as flip-flop clock and clear signals can be derived from conductors 170 and 190 via PLCs 172, programmable invert and buffering circuitry 230, and conductors 220. Alternative or additional control signals can be derived from conductors 90 and 100 via PLCs 94. The main output 38 of each logic module 30 in FIG. 7 can drive a respective one of input/output pins 130 directly or via an input/output cell 600 of the type shown in FIG. 5. If input/output cells 600 are omitted, the logic modules 30 in FIG. 7 can perform many of the functions of those cells. To facilitate this the peripheral bus signals 190, 210, and 212 shown in FIG. 5 can be applied directly to the logic modules 30 shown in FIG. 7 via PLC networks 300 (similar to networks 300 in FIG. 4).

The embodiment shown in FIG. 7 has the advantage of the FIG. 6 embodiment, namely that each input/output pin 130 at each end of a row can be driven by any conductor 60 or 70 appearing at that end of the row. An additional advantage of the embodiment shown in FIG. 7 is that the flexibility of the I/O circuitry (especially the flip-flops in that circuitry) is increased by the associated combinatorial logic (including PLCs 92 with fully populated inputs, local feedback conductors 100, and ULBs 32).

It will be appreciated that various features shown in FIG. 7 can be omitted if desired. For example, it may not be desired to provide local feedback conductors 100 and thus those conductors, as well as drivers 200, can be omitted. Or it may not be desired to provide flip-flops 34, especially if input/output cells 600 with their flip-flops are provided. If flip-flops 34 are not provided in FIG. 7, then components such as 94, 172, 230, and 234 can also be omitted from FIG. 7. The logic regions 20 of the type shown in FIG. 7 can be identical to all other logic regions 20 on device 10, with all the normal functionality of such logic regions, but with the depicted additional connections to input/output pins 130. Alternatively, the logic regions 20 of the type shown in FIG. 7 can have less than the normal logic region functionality.

Figure 8:
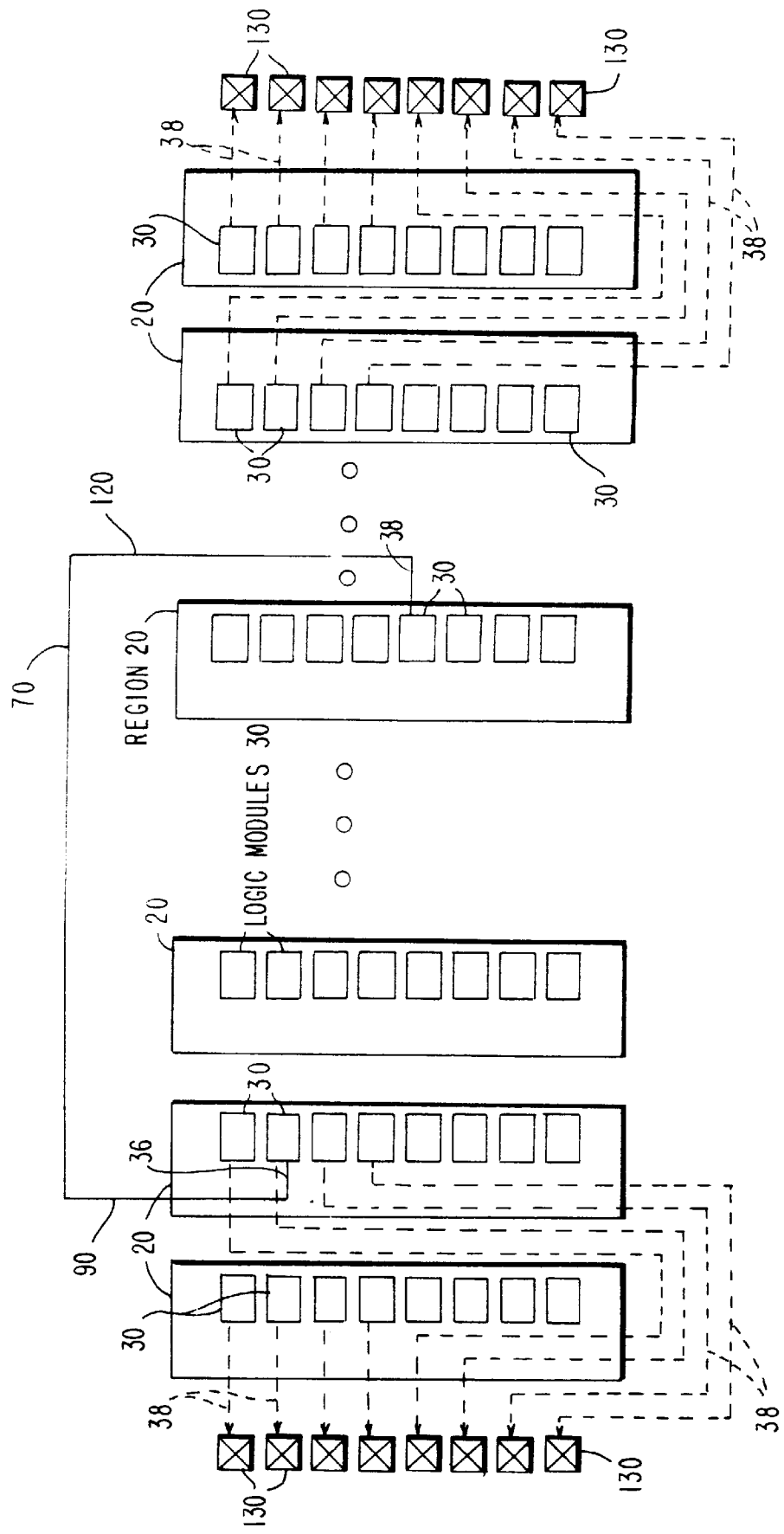
FIG. 8 is a simplified schematic block diagram showing still another illustrative modification of apparatus shown in FIG. 3 in accordance with this invention.

FIG. 8 shows another alternative embodiment in accordance with this invention. This embodiment is somewhat like the embodiment shown in FIG. 7 except that the logic modules 30 which can drive the input/output pins at each end of each row are more distributed along the row rather than all being in a special region 20 at each end of the row. As shown in FIG. 8, for example, the main outputs 38 of the top four logic modules 30 in the left-most region 20 have dedicated connections (also numbered 38) to the top four horizontal input/output pins 130 at the left end of the row. Similarly, the main output 38 of the top four logic modules 30 in the next-to-left-most region 20 have dedicated connections 38 to the other four horizontal input/output pins 130 at the left end of the row. A similar arrangement is provided at the right-hand end of the row, with the top four logic modules 30 in each of the two right-hand regions 20 having dedicated connections to the input/output pins at the right-hand end of the row. As in the case of FIG. 7, input/output cells 600 of the type described above may be used to couple each dedicated connection 38 to the associated input/output pin 130. The signal path 120, 70, 90, 36 in FIG. 8 illustrates how the output of any logic module in the depicted row can get to any input/output-pin-driving logic module in the row, and thereby to any input/output pin 130 associated with that row.

The embodiment shown in FIG. 8 has the advantages of the FIG. 7 embodiment, but also reduces the concentration of special requirements that may be needed for logic modules that are to be used to drive input/output pins. For example, the number of inputs required to a region 20 that is driving input/output pins may have to be quite large. Distributing the input/output-pin-driving logic modules 30 over several regions 20 distributes this region input requirement over several regions, thereby reducing the risk that sufficient region feeding capacity may not have been provided.

Although FIG. 8 shows a particular arrangement of the input/output-pin-driving logic modules, it will be understood that many other arrangements are also possible. For example, the input/output pin driving logic modules could be distributed over more than four of the regions in a row, or they could be distributed randomly throughout the row.

Figure 9:
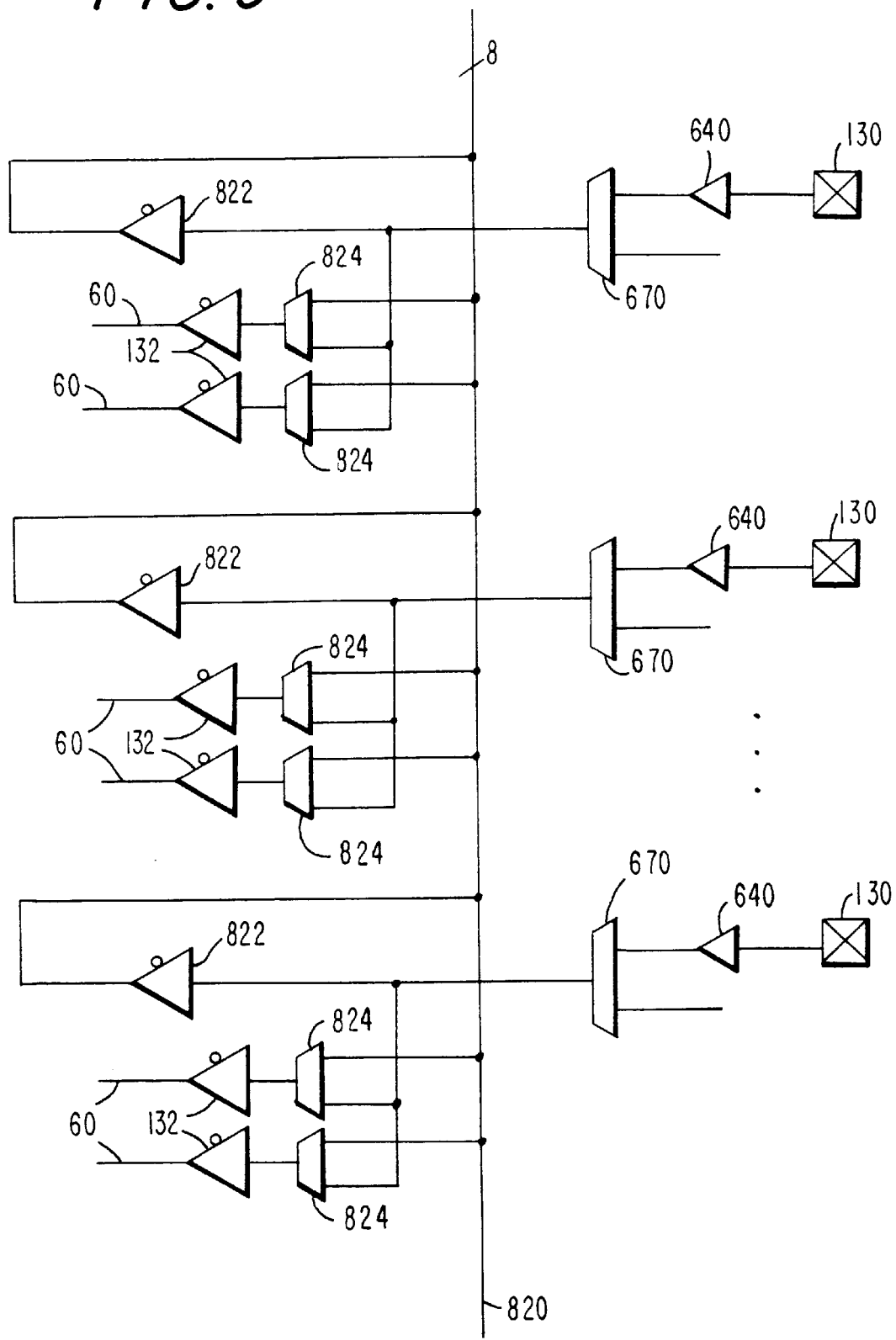
FIG. 9 is a simplified schematic block diagram showing yet another illustrative modification of apparatus shown in FIG. 3 in accordance with this invention.

FIG. 9 shows structure in accordance with the present invention for increasing the flexibility with which inputs to particular input/output pins can be introduced into the core logic of the device. FIG. 9 shows several representative input/output pins 130 at one end of one row of the device. Associated components 640, 670, and 132 are as described earlier (e.g., in connection with FIG. 5) and allow each input/output pin 130 to drive either or both of two conductors 60 in the row associated with those input/output pins. Additionally, however, there are several conductors 820 which extend continuously past all of the rows on the device.

Each input/output pin 130 can drive one of these conductors 820 via a programmable tri-state driver 822. PLCs 824 then allow any of drivers 132 to be used to drive the associated conductor 60 either from the normally associated input/output pin 130 or from a conductor 820. In this way an input to an input/output pin 130 associated with any row can be routed to any row in the device. This facilitates input flexibility to the device.

It will be noted that even without conductors 820 an input to any row can be routed to any other row via a path that includes a conductor 60 in the row initially receiving the input, a conductor 62, a PLC 270, a driver 240, a conductor 80, a conductor 82, a PLC 242, a driver 244, and finally a conductor 60 in the different row to which the input is to be routed. However, the embodiment shown in FIG. 9 has the advantage that the routing is more direct and a conductor 60 in the row initially receiving the input is not taken up just to get the input to another row.

Figure 10:
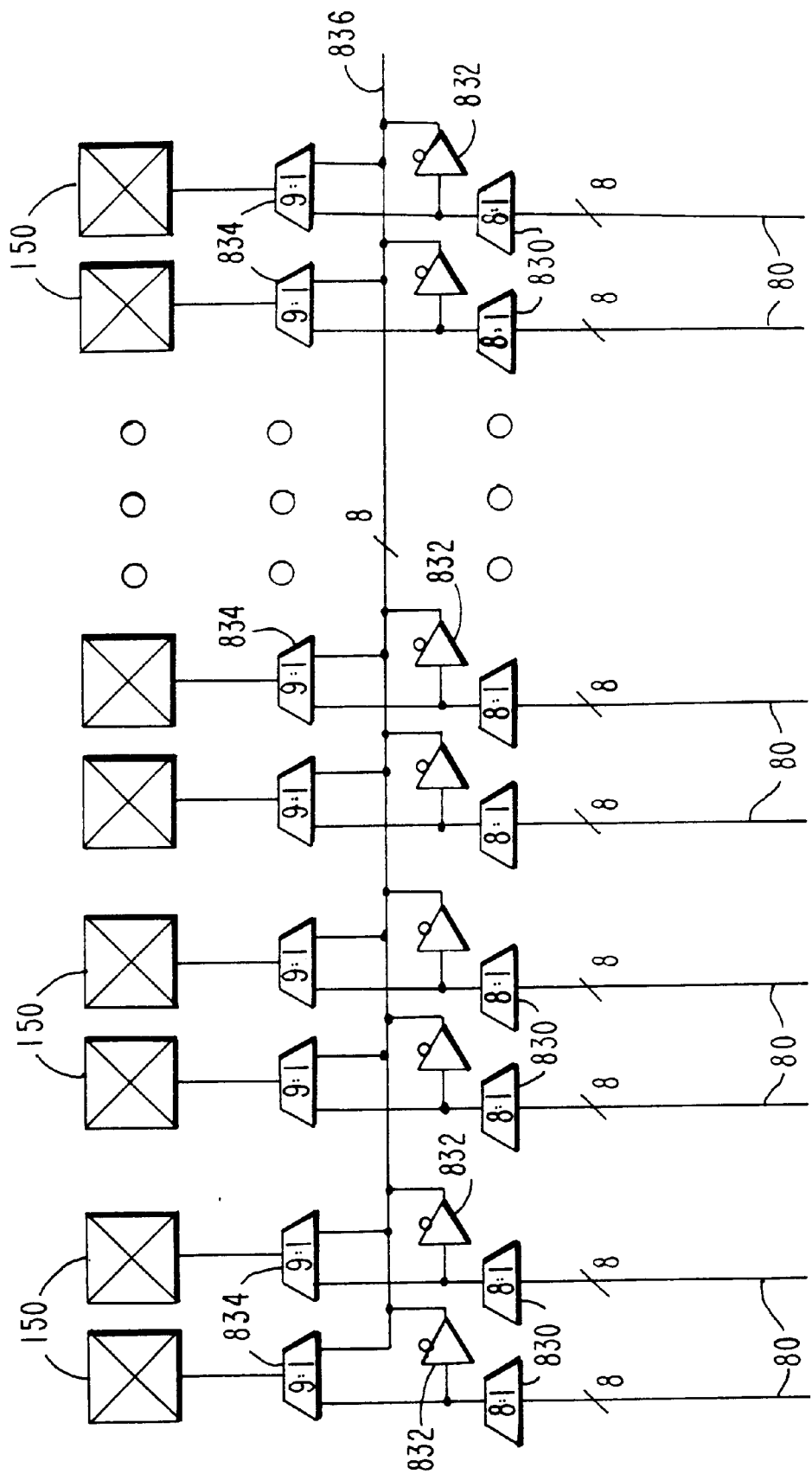
FIG. 10 is a simplified schematic block diagram showing another illustrative modification of apparatus shown in FIG. 1 in accordance with this invention.

FIG. 10 shows another structure in accordance with this invention which can be used to increase output flexibility. This structure is illustrated in the context of the vertical conductors 80 and the vertical input/output pins 150. At each end of each column two groups of eight conductors 80 are respectively applied to two PLCs 830. (Only the upper end of several representative columns is shown in FIG. 10.) In the depicted preferred embodiment each of PLCs 830 is an 8 to 1 multiplexer. Thus each of PLCs 830 can select one of its inputs for application to an associated tri-state driver 832 and a further PLC 834 (a 9 to 1 multiplexer in the depicted preferred embodiment). Each tri-state driver 832 is programmable to apply the signal applied to it to one of eight conductors 836 that extend continuously across all of the columns of the device. All of conductors 836 are connected as inputs to all of the PLCs 834 at the adjacent end of the columns. Each of PLCs 834 can select one of its inputs as the signal to be applied to the associated input/output pin 150. In this way any signal which is available on a conductor 80 at either end of a column can be applied to an input/output pin 150 along the top or bottom edge of the device that is adjacent to that end of the column.

Figure 11:
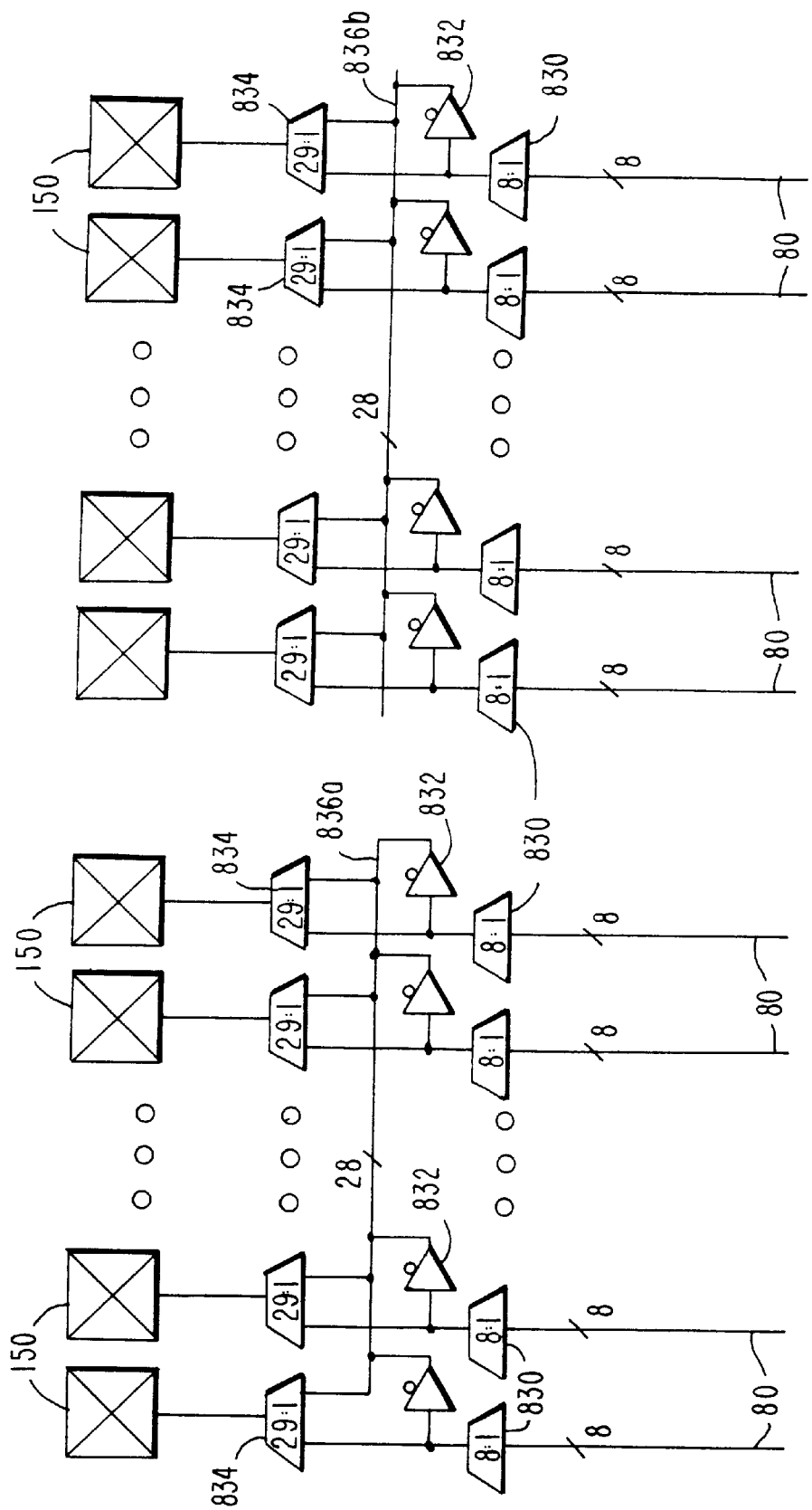
FIG. 11 is a simplified schematic block diagram showing still another illustrative modification of apparatus shown in FIG. 1 in accordance with this invention.

FIG. 11 shows an embodiment similar to FIG. 10 except that in FIG. 11 each conductor 836a or 836b extends continuously along either the left or right half of the columns of the device. Thus in this embodiment any conductor 80 available at either end of a column can drive any input/output pin 150 in the associated left or right half of the device and at the top or bottom edge of the device which is adjacent to that end of the column.

Figure 12:
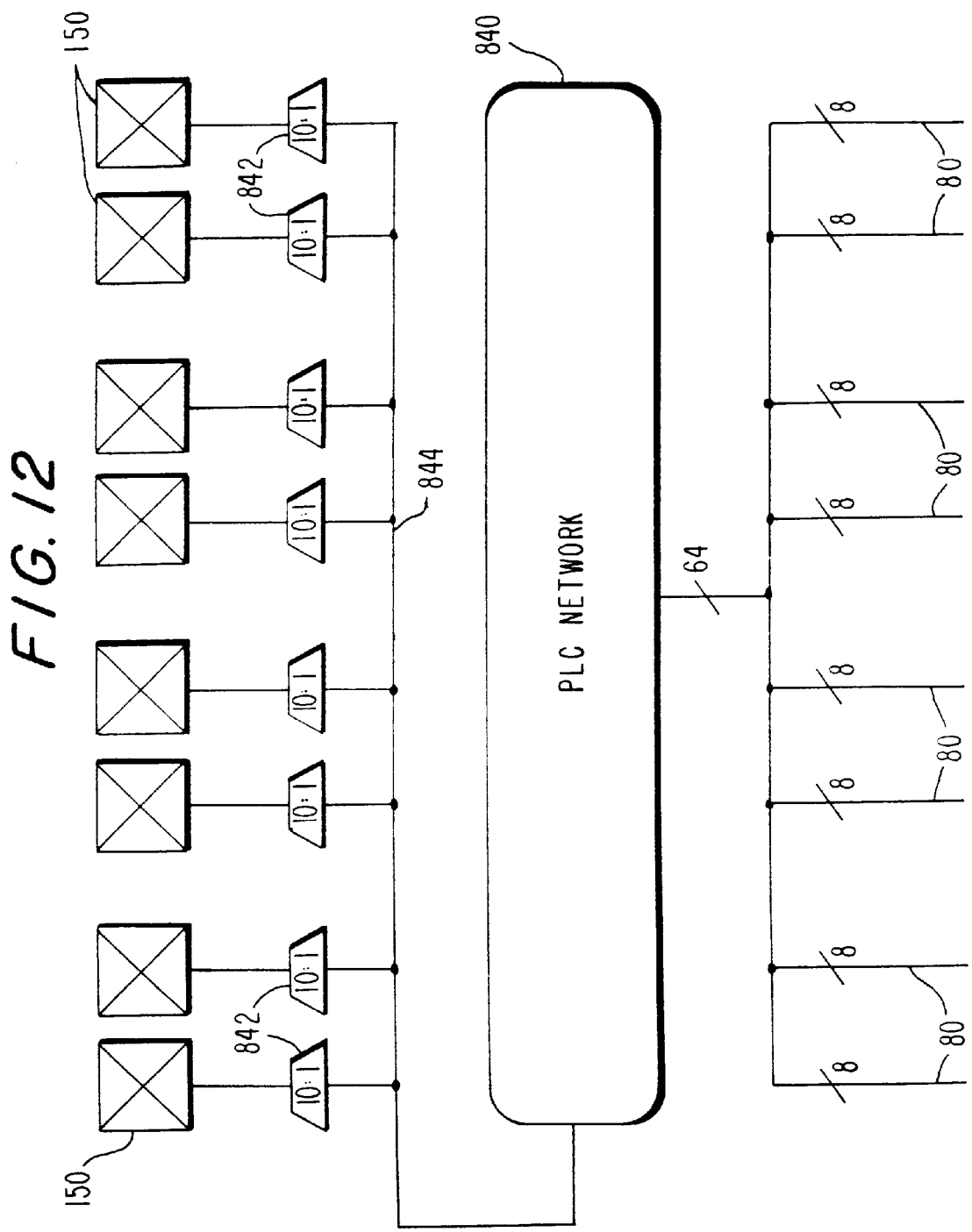
FIG. 12 is a simplified schematic block diagram showing yet another illustrative modification of apparatus shown in FIG. 1 in accordance with this invention.

FIG. 12 shows another embodiment in accordance with this invention for increasing output flexibility. Again this embodiment is illustrated in the context of outputs from vertical conductors 80 to vertical input/output pins 150. In this embodiment the conductors 80 from several (e.g., four) adjacent columns that are available at each end of the columns are the inputs to a PLC network 840 at that end of the columns. PLC network 840 includes a partial population of possible programmable connections between the 64 conductors 80 feeding it and ten output conductors 844 from network 840. Each of conductors 844 is an input to each of PLCs 842, each of which can select one of its inputs for connection to an input/output pin 150 that is associated with that PLC 842. This structure provides a high degree of flexibility for permitting the conductors 80 in a group of columns to reach any of the input/output pins 150 associated with that group of columns. This structure greatly increases the number of input/output pins 150 that the conductors 80 associated with each column can reach. At the same time, however, it avoids the expense (in terms of chip real estate consumed) of completely general interconnectivity between a relatively large number of conductors 80 and a relatively large number of input/output pins 150.

It will be understood that the foregoing is only illustrative of the principles of this invention, and that various modifications can be made by those skilled in the art without departing from the scope and spirit of the invention. For example, the numbers of various circuit components can be changed in many different ways to produce devices of widely different sizes and complexity. As another example of modifications within the scope of this invention, the invention can be used with programmable logic array devices which have features other than those shown herein. By way of illustration, the invention can be used with devices that include user-programmable memory and/or cascade and carry connections between logic modules as shown, for example, in Cliff et al. U.S. Pat. No. 5,689,195.

The invention claimed is:

1. A programmable logic array device comprising:

a plurality of regions of programmable logic disposed on said device, each of said regions being programmable to produce an output signal which is any of a plurality of logic functions of a plurality of input signals applied to that region;

a plurality of conductors extending adjacent to said regions, each said conductor being selectively usable for conveying signals to, from, and between said regions;

a plurality of device output pins associated with said regions;

a multiplicity of first programmable logic connectors, each of which receives signals from a respective one of a multiplicity of subpluralities of said conductors, and each of which is programmable to produce a signal which is indicative of at least one of the signals it receives; and a plurality of second programmable logic connectors, each of which receives signals produced by a plurality of said first programmable logic connectors, and each of which is programmable to produce a signal which is indicative of at least one of the signals it receives for application to a respective one of said device output pins; wherein:

one of said first programmable logic connectors and a subplurality of said second programmable logic connectors are programmable to produce a signal which is indicative of a signal received by said one first programmable logic connector for application to any one of a subplurality of said device output pins.

2. The apparatus defined in claim 1 wherein said regions are disposed on said device in a linear array, wherein said linear array is one of a plurality of similar linear arrays disposed on said device, and wherein each of said second programmable logic connectors receives signals only from first programmable logic connectors which in turn only receive signals from conductors extending adjacent to regions in one of said linear arrays.

3. A programmable logic array device comprising:

a plurality of regions of programmable logic disposed on said device, each of said regions being programmable to produce an output signal which is any of a plurality of logic functions of a plurality of input signals applied to that region;

a plurality of conductors extending adjacent to said regions, each said conductor being selectively usable for conveying signals to, from, and between said regions;

a plurality of device output pins associated with said regions;

a multiplicity of first programmable logic connectors, each of which receives signals from a respective one of a multiplicity of subpluralities of said conductors, and each of which is programmable to produce a signal which is indicative of at least one of the signals it receives; and a plurality of second programmable logic connectors, each of which receives signals produced by a plurality of said first programmable logic connectors, and each of which is programmable to produce a signal which is indicative of at least one of the signals it receives for application to a respective one of said device output pins; wherein:

one of said first programmable logic connectors and a subplurality of said second programmable logic connectors are programmable to produce a signal which is indicative of a signal received by said one first programmable logic connector for application to a subplurality of said device output pins.

* * * * *

UNITED STATES PATENT AND TRADEMARK OFFICE
CERTIFICATE OF CORRECTION

PATENT NO    : 6,049,225

DATED        : April 11, 2000

INVENTION    : Joseph Huang, et al.

It is certified that error appears in the above-identified patent and that said Letters Patent is hereby corrected as shown below:

Column 4, line 57, delete "is" after "38".

Column 7, line 14, delete "is" after "column".

Column 8, line 1, "a closed the" should be --a closed loop around the--; and line 41, "290select" should be --290 select--.

Column 9, line 21, "END2" should be --ENB2--; and line 40, delete "is" after "one".

Column 11, line 35, delete "is" after "in a".

Column 12, line 3, "100 and" should be --100, and--.

Signed and Sealed this

Twenty-seventh Day of March, 2001

Attest:

NICHOLAS P. GODICI

Attesting Officer

Acting Director of the United States Patent and Trademark Office